United States Patent [19]

Augis et al.

[11] 4,337,133
[45] Jun. 29, 1982

[54] HARD GOLD SURFACES

[75] Inventors: Jacques A. Augis, Pickerington; Christopher C. C. Lo, Whitehall, both of Ohio

[73] Assignee: Bell Telephone Laboratories, Incorporated, Murray Hill, N.J.

[21] Appl. No.: 217,914

[22] Filed: Dec. 18, 1980

Related U.S. Application Data

[63] Continuation of Ser. No. 50,342, Jun. 20, 1979, abandoned.

[51] Int. Cl.³ .............................................. C23C 15/00
[52] U.S. Cl. ................................................ 204/192 C
[58] Field of Search ......................... 204/192 C, 43 G

[56] References Cited

U.S. PATENT DOCUMENTS

| 3,437,888 | 4/1969 | Hall | 357/71 |
| 3,530,049 | 9/1970 | Scherzer et al. | 204/43 |
| 3,711,383 | 1/1973 | Schiekel et al. | 204/29 |

FOREIGN PATENT DOCUMENTS

| 49-50234 | 10/1974 | Japan | 204/43 G |
| 322411 | 11/1972 | U.S.S.R. | 204/43 G |

Primary Examiner—Aaron Weisstuch
Attorney, Agent, or Firm—Walter G. Nilsen

[57] ABSTRACT

A process is described for making hard gold films suitable for electrical contact surfaces. A particular advantage of these films is that they operate well at high temperatures without forming resistive films on the contact surface.

6 Claims, 1 Drawing Figure

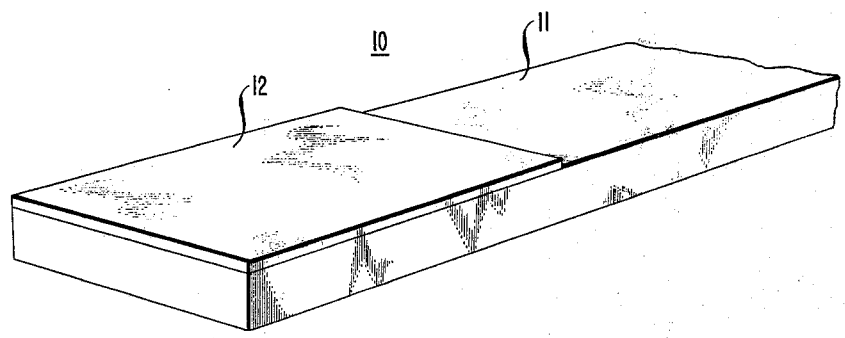

HARD GOLD SURFACES

CROSS-REFERENCE TO RELATED APPLICATION

This application is a continuation of application Ser. No. 50,342, filed June 20, 1979, now abandoned.

BACKGROUND OF THE INVENTION

Gold has many important industrial applications including production of jewelry and production of electronic circuits, electrical contact surfaces, and components. In recent years, industrial use of gold has become increasingly important. There are several reasons for this increased use and importance of gold. First of all, gold does not form a surface insulating film such as a gold oxide film. For this reason, gold has a high surface luster which is quite attractive when used in jewelry articles. For the same reason, its use in electrical circuits and components is highly desirable because surface contact to gold usually exhibits low electrical resistance.

Gold also has the advantage of being chemically inert. The use of gold often increases the lifetime and reliability of devices and articles since gold is not affected by many chemicals or adverse conditions of temperature and humidity. A particular case in point is the production of integrated electronic circuits. Here quite thin and narrow conducting paths are required. Many metals (i.e., copper) might be satisfactory as far as electrical conductivity is concerned, but they rapidly degrade with time. Gold has the advantage of being inert, and also exhibits quite high electrical conductivity.

Because of its excellent electrical contact properties, gold is often used in electrical connectors, switches and relays. By the addition of small amounts of various elements (for example, arsenic, cobalt, nickel), gold can be made quite hard and resistant to abrasion. The particular procedure for hardening the gold depends on the process for producing the gold surface. For example, certain applications might invole an electroplating procedure and another an inlay or evaporation procedure. Various procedures are outlined in a book entitled, *Gold Usage* by W. S. Rapson and T. Groenewald, Academic Press, New York, 1978.

SUMMARY OF THE INVENTION

The invention is a process for producing hard gold films. The process involves sputtering gold together with noble refractory metal such as ruthenium, rhodium, osmium, iridium, and rhenium. It is preferred that the temperature of the substrate be kept below 150 degrees C. or lower if possible. This procedure produces hard gold films free from organic matter which might adversely affect the contact resistance of the gold film. The film is also free of metals which might diffuse to the contact surface and oxidize so as to procedure a high resistance film. Hard gold films made in accordance with the invention have long life, long-time stability, and do not form high resistance layers on their surfaces.

BRIEF DESCRIPTION OF THE DRAWING

The FIGURE shows in perspective view an electrical connector pin with gold film made in accordance with the invention.

DETAILED DESCRIPTION

The invention is a process for making hard gold films on substrates by sputtering. The gold films contain small amounts of noble refractory metals such as rhodium, ruthenium, rhenium, osium and iridium. Rhodium is preferred because of availability and the small amount of material needed to produce hard gold films. Low substrate temperatures are preferred because they yield harder surface films. The surface may be kept cool in a variety of ways including conduction cooling and liquid-circulation (water) cooling.

Compositions may vary over large limits, but excellent results are obtained in the range of 0.05 to 5 weight percent noble refractory metal. For many applications, 0.1 to 3.0 weight percent is preferred. With rhodium, best results are obtained in the range from 0.2 to 0.8 weight percent. Substrate temperatures below 150 degrees C. are preferred. Below 80 degrees C., surface hardnesses of 200 Knoop are usually obtained. Most preferred are temperatures below 50 degrees C. because of the surface hardness obtained and the relative ease of cooling the substrate to that temperature.

Film thickness is not critical as far as the properties of the gold are concerned. However, for gold sputtering and the usual applications of gold films, it is preferred that film thickness be between 100 Angstroms and one millimeter.

The sputtering operation is carried out in the usual manner. A variety of gases may be used, but an inert carrier gas such as argon is preferred. Also, the sputtering gas often becomes an impurity in the gold film and the chemical inertness of the gas prevents formation of electrically insulating (oxide) layers on the gold film surface. Argon pressure may vary over large limits but 1-50 millitorr appears most convenient. Water cooling of the substrate is preferred so as to maintain a low substrate temperature.

Various sputtering procedures may be used including dc diode sputtering, magnetron sputtering, glow discharge sputtering, thermionic electron emission sputtering, radio-frequency sputtering, etc.

The procedures may be used to fabricate a variety of articles and devices including jewelry, rings, watches, etc., as well as electrical devices such as connectors, relay contacts, etc. The procedures are especially advantageous for devices with electrical contacts where long life and continued low contact resistance are important. Also, as shown below, the procedures are particularly advantageous where the electrical contact is exposed to high temperatures, especially between 250 and 400 degrees C.

Some of the advantages of gold films prepared as described above are physical and chemical stability at high temperatures. To demonstrate these advantages, several experiments were carried out comparing contacts prepared in accordance with the invention with more conventional cobalt hardened gold. The gold films were prepared by dc diode sputtering using an argon pressure of approximately 20 millitorr. The target was 0.5 weight percent rhodium in gold for the Rh/Au samples and 0.5 weight percent cobalt in gold for the Co/Au samples. Sputtering was carried out on copper substrates. The Rh/Au samples were 15 μm thick. For comparison, Co/Au samples were made up by a conventional gold electroplating procedure using a citrate-buffered bath with 0.2 weight percent cobalt. The thickness of the Co/Au films was approximately 13 μm. The copper was removed with nitric acid and the two alloys (Rh/Au and Co/Au) heat treated and measured for hardness. Heat treatment was carried out in air for two hours at 250 degrees C., 350 degrees C., and 400 degrees C. The hardness of the Rh/Au samples remained constant on exposure to the heat treatment, even at 400 degrees C. for two hours. In contrast, the Co/Au samples softened slightly at 250 degrees C. and became noticeably soft at 300 degrees C. After heat treatment at 350 degrees C., the hardness (Vickers Hardness, $VHN_{10}$) decreased 15 percent and after a heat treatment at 400 degrees C., decreased 30 percent. These experiments demonstrate that the hardness of Rh/Au films is much more stable than the hardness of Co/Au films especially at high temperatures. Typical hardness numbers of these films are between 100 and 300 $VHN_{10}$ (Vickers Hardness Numbers).

In addition to the hardness stability set forth above, the Rh/Au samples exhibited excellent surface color stability on being exposed to the heat treatment in air described above. In contrast, the Co/Au samples became progressively darker as the temperature of the heat treatment was increased. The Co/Au surface darkened after the two hour heat treatment at 300 degrees C. and became dark purple after the heat treatment at 350 degrees C. After the two hour heat treatment at 400 degrees C. the surface became dark blue. It is believed that the color change for heat treated Co/Au was due to the diffusion and oxidation of cobalt and organic co-deposits in the gold plates.

Experiments were also carried out to show the effect of surface electrical contact resistance as a function of heat treatment. The electrical contact resistance was measured using a pure gold probe of about 40 mil diameter at 100 gms load. For the two plated samples (no heat treatment) the contact resistance was found to be 0.67 milliohms for Rh/Au and 0.76 milliohms for Co/Au. The samples were then heat treated in 200 degrees C. in air for seven days. The contact resistance of the samples were then measured again using precisely the same procedure as with the unheated samples. The average and mean values of the contact resistance for Rh/Au were 83 milliohms and 59 milliohms respectively. The mean value for the Co/Au sample was 18 ohms. The average value for the heat treated Co/Au sampls is somewhat meaningless because several measured values exceed hundreds of ohms. It is believed that the large increase in contact resistance of the Co/Au samples is due to cobalt oxide films on the surface.

The FIGURE shows a typical electrical connector pin 10 made of beryllium-copper 11 in which the electrical contact surfaces 12 are plated with Rh/Au in accordance with the invention.

What is claimed is:

1. A process for fabricating an electrical contact with at least one hard metallic film with Vickers Hardness Numbers greater than 100 on a substrate, said metallic film comprising gold, comprising the step of sputtering a gold alloy composition onto the substrate using a carrier gas characterized in that the gold alloy composition consists essentially of between 0.05 and 5 weight percent noble refractory metal remainder gold, said noble refractory metal consisting essentially of at least one element selected from the group consisting of rhodium and ruthenium and the substrate is maintained at a temperature below 80 degrees C. during the sputtering procedure.

2. The process of claim 1 in which the amount of noble refractory metal is between 0.1 and 3.0 weight percent.

3. The process of claim 2 in which the amount of noble refractory metal between 0.2 and 0.8 weight percent.

4. The process of claim 1 in which argon is used as the carrier gas.

5. The process of claim 4 in which the pressure of the carrier gas is between 1 and 50 millitorrs.

6. The process of claim 1 in which the substrate is maintained at a temperature below 50 degrees C.

* * * * *